United States Patent [19]

Kuo et al.

[11] 4,198,697
[45] Apr. 15, 1980

[54] MULTIPLE DUMMY CELL LAYOUT FOR MOS RANDOM ACCESS MEMORY

[75] Inventors: Chang-Kiang Kuo, Houston; Shyh-Chang Tsaur, Stafford, both of Tex.

[73] Assignee: Texas Instruments Incorporated, Dallas, Tex.

[21] Appl. No.: 915,692

[22] Filed: Jun. 15, 1978

[51] Int. Cl.² .............................................. G11C 7/00
[52] U.S. Cl. ................................ 365/210; 365/149; 365/205
[58] Field of Search ..................... 365/149, 205, 210; 307/DIG. 3

[56] References Cited

U.S. PATENT DOCUMENTS

| | | | |
|---|---|---|---|
| 4,038,646 | 7/1977 | Mehta et al. | 365/205 |
| 4,050,061 | 9/1977 | Kitagawa | 365/205 |
| 4,117,545 | 9/1978 | Inadachi | 365/210 |
| 4,118,794 | 10/1978 | Mizuno et al. | 365/149 |

Primary Examiner—Stuart N. Hecker
Attorney, Agent, or Firm—John G. Graham

[57] ABSTRACT

A random access memory device of the MOS integrated circuit type employs an array of rows and columns of one-transistor storage cells with bistable sense amplifier circuits at the center of each column. A plurality of dummy cells are connected to each column line half instead of a single dummy cell, and one of the dummy cells is addressed when a memory cell on the opposite side of the sense amplifier is addressed by one of the row lines. Time delay is made more equal by spacing the dummy cells along each column line half, and addressing a dummy cell which is spaced about the same distance from the sense amplifier as the selected memory cell on the other side.

6 Claims, 4 Drawing Figures

MULTIPLE DUMMY CELL LAYOUT FOR MOS RANDOM ACCESS MEMORY

RELATED CASE

The subject matter of this application is related to the subject matter disclosed in my copending application Ser. No. 915,632, filed herewith and assigned to Texas Instruments.

BACKGROUND OF THE INVENTION

This invention relates to semiconductor memory devices, and more particularly to an improved dummy cell layout for an N-channel MOS memory device of the type employing one-transistor memory cells.

MOS random access memory (RAM) devices, widely used in the manufacture of digital equipment such as minicomputers, continue to offer increased speed capabilities and cost advantages. The cost per bit of storage using MOS RAMs goes down as the number of bits or memory cells per package goes up. Successively larger RAMs have been standards in the industry. A RAM containing 4096 bits, for example, is shown in U.S. Pat. No. 3,940,747 issued Feb. 24, 1976 to Kuo and Kitagawa, assigned to Texas Instruments, while 16,384 bit or "16K" RAMs are described in U.S. Pat. Nos. 4,050,061 and 4,081,701, assigned to Texas Instruments, and in articles in *Electronics*, Feb. 19, 1976, pp. 116–121, and May 13, 1976, pp. 81–86.

As the number of bits in a semiconductor chip is increased, the cell size decreases, and the magnitude of the storage capacitor in each cell of necessity decreases. Also, the number of cells on a digit line in the array of cells increases, so the capacitance of this line increases, and the delay between the time a cell is addressed and a signal reaches the sense amplifier becomes longer, on average. These factors increase the difficulty in sensing the data signal which exists on a digit line. A full logic level difference between a "1" and a "0" in one of these devices may be perhaps 5 volts; however, the difference in voltage between a "1" and a "0" for the data coupled to a column line and reaching the sense amplifier in the center of the memory array from the selected one-transistor cell and dummy cell may be only fifty millivolts or less. Various circuits for sensing these low-level signals have been used. Memory cell layouts with sense amplifiers in the center of each column line are shown in U.S. Pat. No. 3,940,747, and the *Electronics* articles mentioned above, and in U.S. Pat. No. 3,838,404 to Heeren, as well as in *Electronics*, Sept. 13, 1973, Vol. 46, No. 19, pp. 116–121, and *IEEE Journal of Solid State Circuits*, Oct. 1972, p. 336, by Stein et al. In each of these circuits, dummy cells are connected to the column lines at positions either adjacent the sense amplifiers or adjacent the outer edge of the column line halves. In either case, the difference in delay can be, at worse case, the time for a signal to propogate the entire length of the column line half. This can render the initial sensing ambiguous when dealing with very small signals. Ideally, the two signals should reach the sense nodes of the sense amplifier at the same time for maximum resolution.

It is therefore a principal object of this invention to provide a dummy cell layout for an MOS RAM, and in particular an arrangement which is of high speed operation as well as high sensitivity.

BRIEF SUMMARY OF THE INVENTION

An MOS RAM employs an array of rows and columns of one-transistor storage cells with bistable sense amplifier circuits at the center of each column. A plurality of dummy cells are connected to each column line half, instead of a single dummy cell, and one of the dummy cells is addressed when a memory cell on the opposite side is addressed. Time delay is made more equal by spacing the dummy cells along each column line half and selecting one which is about the same distance from the sense amplifier as the selected memory cell on the other side. The signals from the selected dummy cell and from the selected memory cell will reach the sense amplifier at about the same time, on average.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawings, wherein:

DETAILED DESCRIPTION OF SPECIFIC EMBODIMENT

Figure 1:
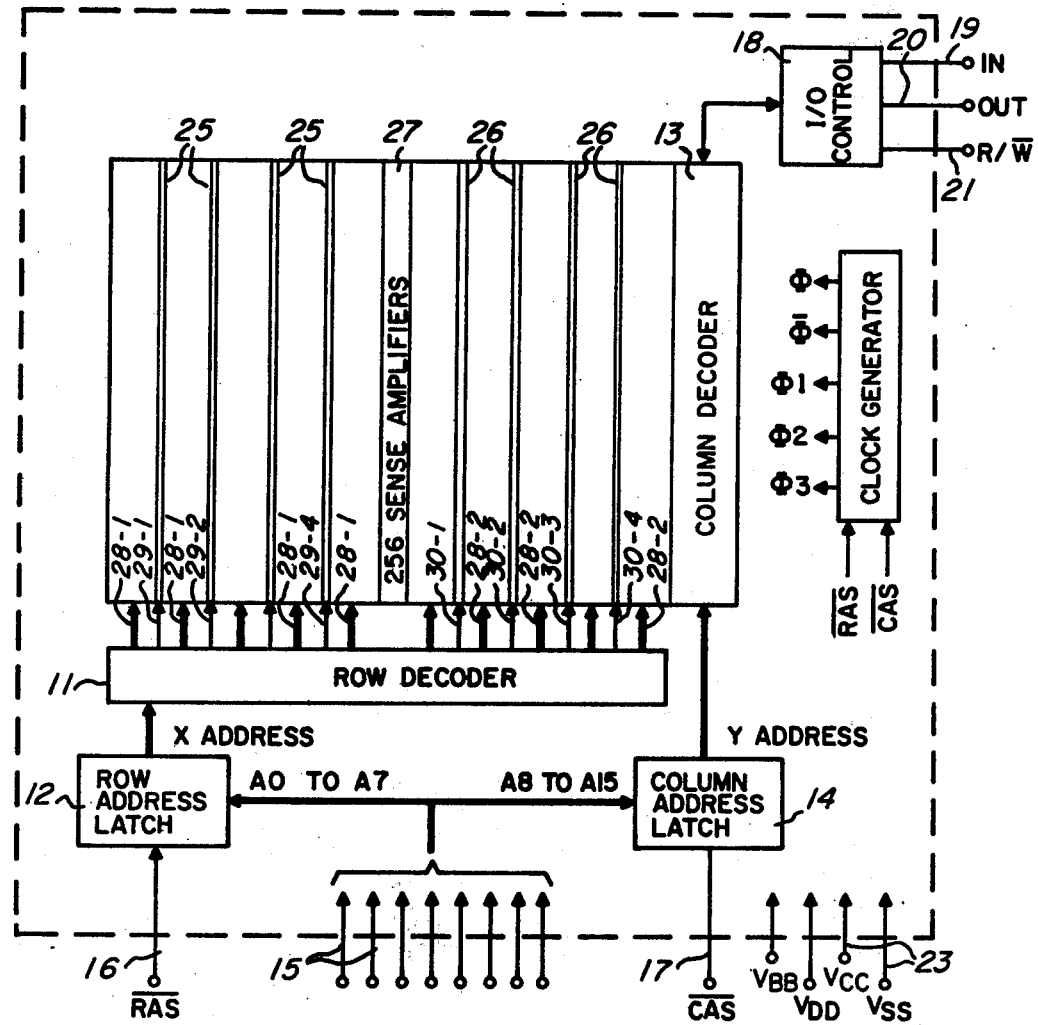
FIG. 1 is a block diagram of a semiconductor memory device which may utilize the invention.

A memory device which may use the invention is shown in FIG. 1. The concept of the invention is particularly useful in very high density memory devices containing, for example, 65536 or 261824 cells on one silicon chip of about 1/10 to 1/20 square inch. This type of device may be made by an N-channel silicon-gate self-aligned MOS process which is described in U.S. patent applications Ser. No. 648,594, filed Jan. 12, 1976, or Ser. No. 722,841, filed Sept. 13, 1976 by C-K Kuo, both assigned to Texas Instruments. The device consists of an array 10 of 65536 memory cells in this illustration generally divided into 256 rows and 256 columns; each cell is a so-called one-transistor cell of the type shown in said applications Ser. No. 648,594 or Ser. No. 722,841. A row decoder 11 selects one of the 256 row lines as determined by a row or X address contained in an eight-bit row address buffer or latch 12, and a column decoder 13 selects one of the 256 column lines as determined by a column or Y address contained in an eight-bit column address buffer or latch 14. These addresses are applied to the chip by eight address lines 15, on a time-share basis or multiplexed. When an $\overline{RAS}$ or row address strobe input 16 (seen in FIG. 3g) is at logic "0" or zero volts, the row address buffers 12 are enabled to accept a row address from the line 15. The row address includes address bits A0 to A7. In like manner a $\overline{CAS}$ or column address strobe input 17 (seen in FIG. 3h) when at logic "0" or zero volts enables the column address buffer 14 to accept a column address (bits A8 to A15) from the lines 15. The row and column addresses must be valid on the pins 15 during the time periods shown in FIG. 3f. Sixteen address bits are needed to uniquely define one bit of 65536 cells ($2^{16}=65,536$). Input/output control circuitry 18 is connected to the array 10 via column decoder 13, and functions to apply data to the column lines from a data input pin 19, or to detect data on the column lines and apply it to a data output pin 20, under control of a read/write R/$\overline{W}$ input 21 as well as under control of various internally generated clock and logic voltages. Alternatively, a single bidirectional I/O port may be used in place of the separate input and output ports 19 and 20. The device requires supply voltages on pins 22; these may include Vdd and Vbb supply voltages as well as ground or Vss. Of course, some circuits are designed to operate on one or three supply voltages rather than two.

Figure 3:
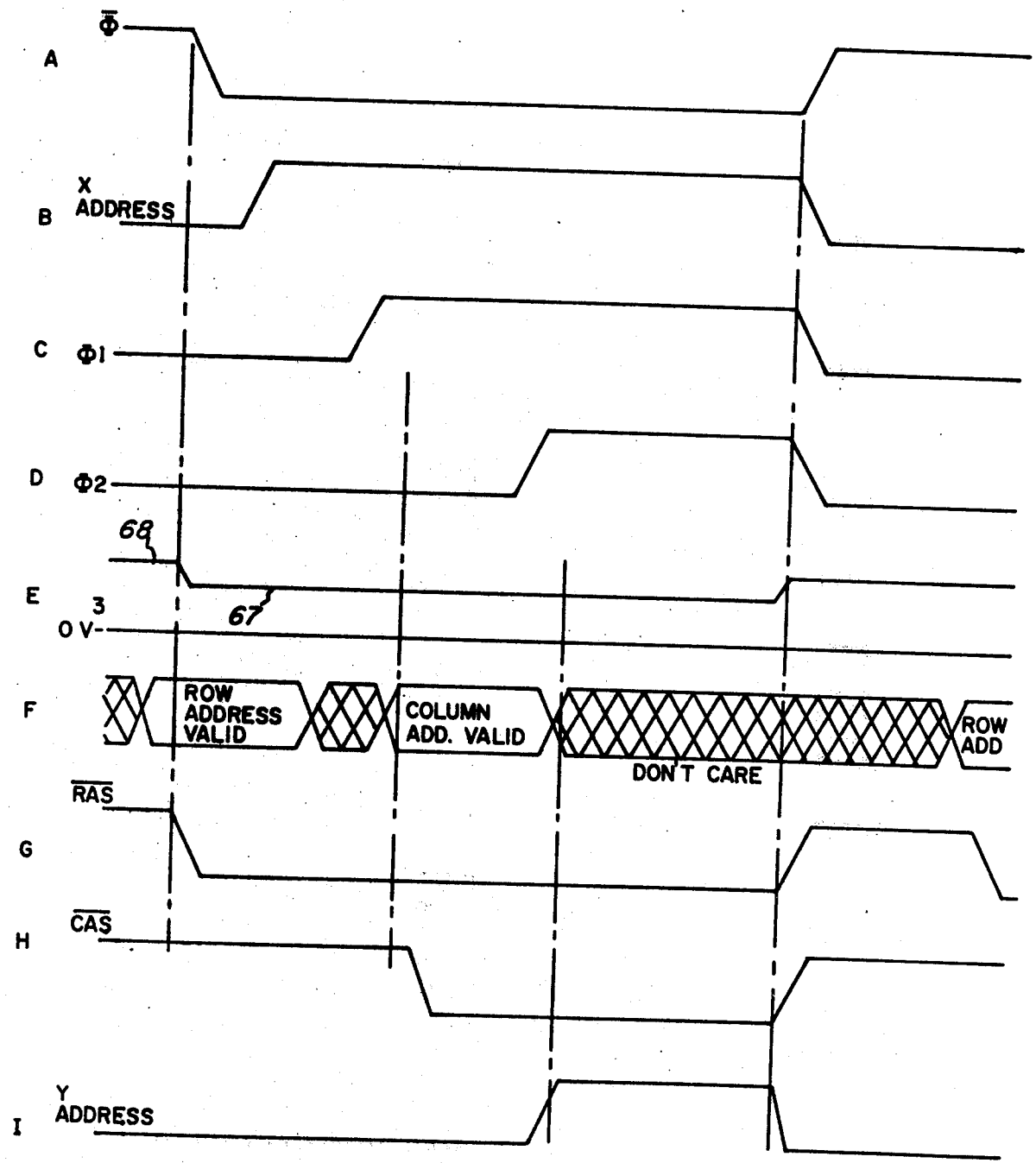
FIG. 3a–3i are graphic representations of voltages appearing at various points in the system of the invention, plotted as a function of time.

According to the invention, a plurality of rows of dummy cells 25 and 26 are positioned in array 10 spaced along each column line half between the center and edge. Although various other numbers of dummy cells may be used, the example shown has four on each side. Each of the 256 column lines has one of a set of 256 identical sense amplifiers 27 positioned in its center. The decoder 11 functions to select one out of the 128 row lines 28-1 on the left side or one of the 128 row lines 28-2 on the right side. A row line is a metal line which extends along most of the width of the chip and drives the gates of 256 MOS transistors in the 256 memory cells associated with this row. The eight address bits A0 to A7 in the row decoder 11 select one row line out of 256 to go high, the remaining 255 remaining low. The row address exists (referred to as X in FIG. 3b) on the selected lines 28-1 or 28-2 during the $\overline{RAS}$ time as seen in FIG. 3g, beginning just after $\overline{RAS}$ goes low and triggered by $\overline{RAS}$. Address bit A7 selects either left or right side, i.e., permits activation of either one of lines 28-1 or one of the lines 28-2. Then the seven bits of A0 to A6 will select one of the 128 lines in the selected half. A7 will also determine activation of dummy cells in the unselected side via dummy cell address lines 29 or 30, during $\overline{RAS}$ as is conventional, then A5 and A6 will determine which of the set of four dummy cell rows on this side is activated. If the most significant bit of the X address is a 0, the selected row of memory cells will be in the right hand side, so a row of dummy cells in the left side will be activated, and vice versa. The sense amplifiers 27 are for the purpose of detecting the low level signal created on the selected column line when a cell is addressed and converting this low level signal to a full logic level. The sense amplifiers 27 as well as the decoders 11 and 13, the address latches 12 and 14 and the I/O control 18 utilize a number of clock voltages, such as $\Phi$, $\overline{\Phi}$, $\Phi1$ and $\Phi2$ as seen in FIG. 3(a)-3(i). These clock voltages, initiated and timed from $\overline{RAS}$ are produced by a conventional clock generator.

Figure 2:
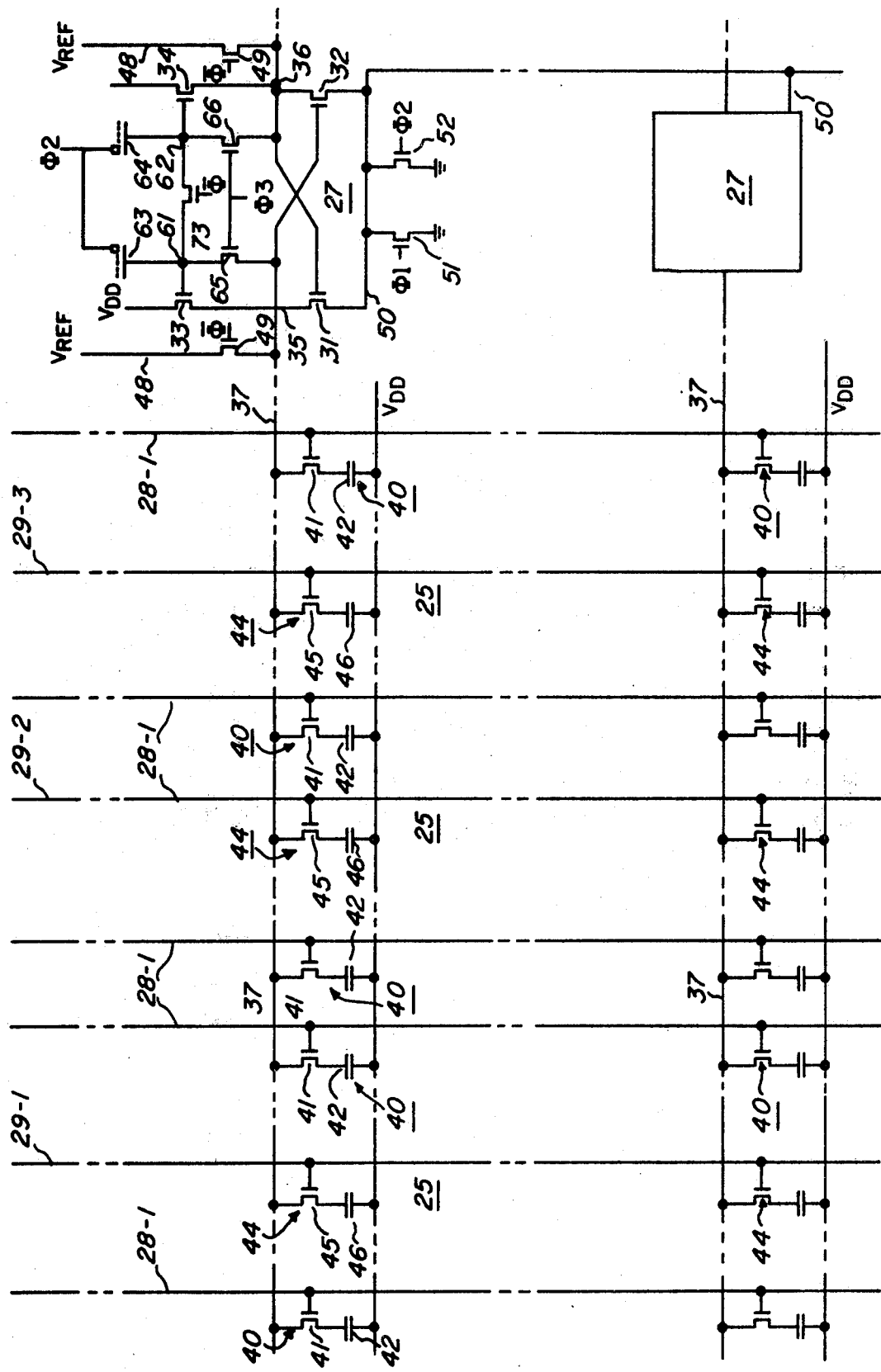
FIG. 2 is an electrical schematic diagram of an array of memory cells for the system of FIG. 1, employing the dummy cell layout of the invention.

Referring to FIG. 2, a memory array according to the invention is illustrated. Each sense amplifier 27 may be of various conventional types; as shown the sense amplifier consists of a flip-flop or bistable circuit having two cross-coulped driver transistors 31 and 32 along with associated load transistors 33 and 34 as disclosed in U.S. Pat. No. 4,081,701. A pair of nodes 35 and 36 are connected to the respective halves 37 and 38 of the column line. These nodes 35 and 36 are connected to the gates of the opposite transistors 31 and 32 to provide the cross-coupled arrangement.

The line 37, half of a column line, has 128 cells 40 connected to it, and so does the line 38. Each cell consists of a transistor 41 and a capacitor 42; the gate of each transistor 41 is controlled by a row line 29-1 or 29-2 (the row line is also referred to as a word line and an X line), and each row line is connected to 256 gates for like transistors 41. In the array 10 of this embodiment, there are 128 row lines on each side of the sense amplifiers 27, and, of course, there are 256 sense amplifiers 27, so only a very small part of the array 10 is seen in FIG. 2.

According to the invention, each sense amplifier 27 has a plurality of dummy cells 44 on each side, connected to the column lines 37 and 38 at spaced positions between the sense node 35 or 36 and the outer edge of the array. The dummy cells are like the storage cells 40, and each includes a transistor 45 and a capacitor 46. Lines 29-1 to 29-4 and 30-1 to 30-4 function to turn on the transistor 45 in the selected row of dummy cells on the opposite side of the sense amplifier from the selected cell 40 as defined by bits A5–A7 of the row address, at the same time the selected storage cell 40 is addressed. A row of dummy cells is selected nearest to the same distance from the sense node 35 or 36 as the selected memory cell 40.

In the sense amplifiers, each column line 37 or 38 is precharged on $\Phi$ from a reference voltage line 48 through a transistor 49. The reference voltage level is selected to be about Vdd-Vt. The flip-flop circuit including the transistors 31 and 32 begins to function before the load transistors 33 and 34 are rendered conductive, when a node 50 connected to the drains of the transistors is coupled to ground at $\Phi1$. As disclosed in U.S. Pat. Nos. 4,050,061 or 4,081,701, the node 50 is grounded through separate paths including in this case two transistors 51 and 52 controlled by clocks $\Phi1$ and $\Phi2$. The transistors 51 and 52 are of different sizes; transistor 51 is the smallest and transistor 52 is about twice its size, measured in device ratio or width to length of the channel. All 256 of the sense amplifiers 27 in the array 10 share the same pair of transistors 51 and 52; a line 53 connects together the nodes 50 of all these sense amplifiers.

When a clock $\Phi1$ (seen in FIG. 3c) goes positive, a sense operation is initiated, and the flip-flop will tend to go toward a stable condition where either transistor 31 is conductive and transistor 32 is cut off, or vice versa. The direction of switching will depend upon the voltage difference between lines 37 and 38 which depends upon whether a one or zero was stored in the selected cell 40. One of the lines 37 or 38 will be at a slightly higher voltage than the other, one of the transistors 31 or 32 will have a slightly higher voltage on its gate than the other, and thus when $\Phi1$ goes positive one transistor will tend to conduct slightly more current than the other.

Figure 4:
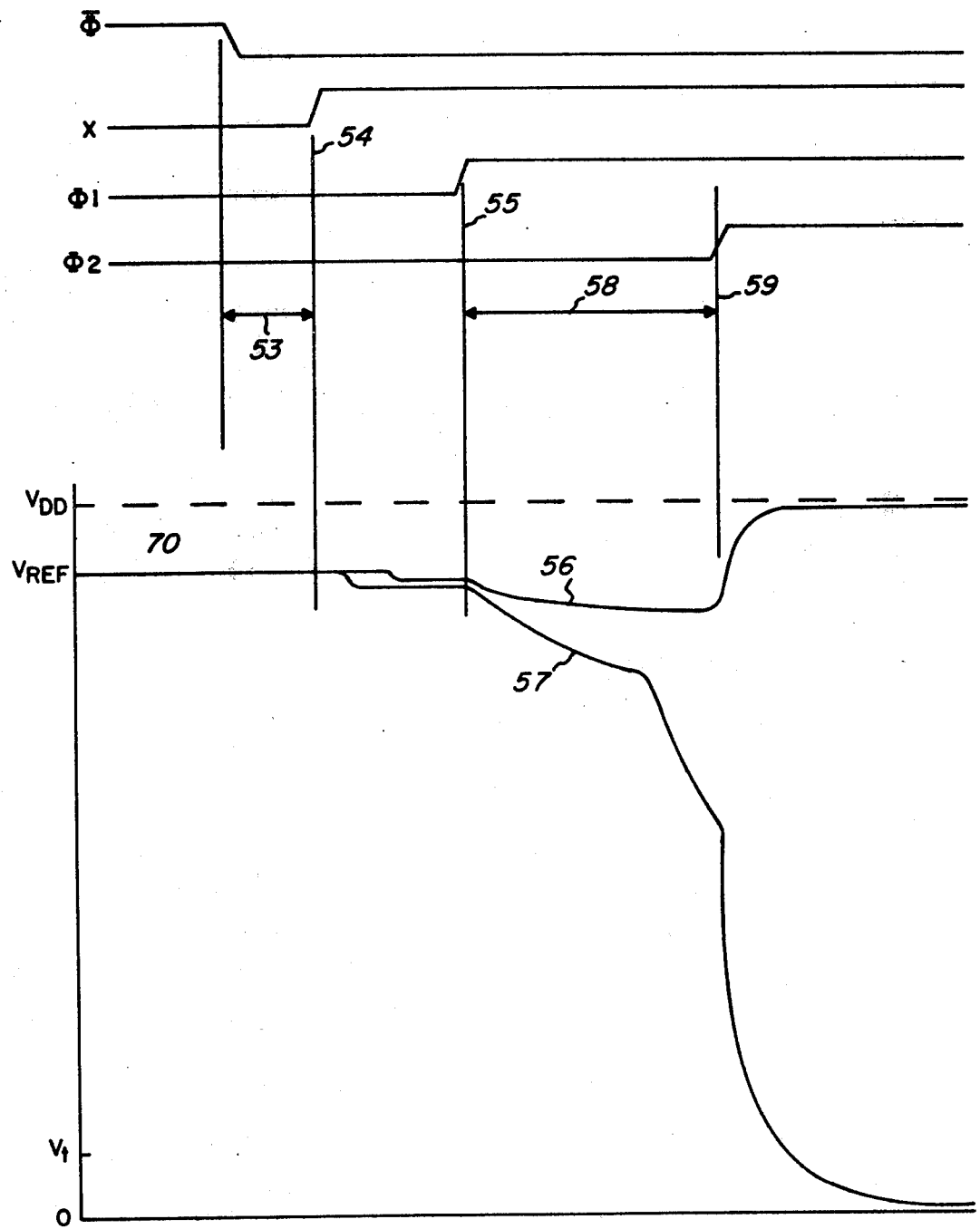
FIG. 4 is a detailed graphic representation of voltage vs. time for the digit lines in the circuit of FIG. 2.

Referring to FIG. 4, the voltage on the digit lines 37 and 38 is shown in enlarged view as a function of time during a sense operation. During the time 53, before $\Phi1$ goes high, and before the address actuates one of the row lines 28-1 or 28-2 and one of the dummy cell address lines 29-1 to 29-4 or 30-1 to 30-4, the voltage 70 on digit lines 37 and 38 is equalized at Vref as defined by charging from the line 48. At a time 54, one of the lines 28-1 or 28-2 goes high, one of the dummy cells is addressed and the voltages on the lines 37 and 38 separate very slightly, perhaps 50 millivolts, due to one of the storage capacitors 42 being connected to one side and a dummy cell capacitor 46 (smaller than 42) being connected to the other. The separation occurs at a variable time after the time 54; the purpose of the invention is to cause the separation to occur at about the same time delay, on average.

At time 55, Φ1 goes high and one of the lines 37 or 38 begins to discharge toward a "0" level while the other discharges only slightly, not over about one volt, as seen by lines 56 and 57. In the time interval 58, prior to the time 59 when Φ2 comes on, if a "1" was stored the transistor 31 or 32 opposite the selected cell will conduct more than the one opposite the dummy cell. If an "0" is stored, the reverse is true.

The sense amplifier 27 or FIG. 2 in this example includes an arrangement for controlling conductance of the load transistors 33 and 34 when Φ2 goes high. Nodes 61 and 62 at the gates of the load transistors 33 and 34 are connected to the clock Φ2 via gated capacitors 63 and 64, and are also connected to the digit lines 37 and 38 via transistors 65 and 66 clocked by Φ3 (seen in FIG. 3c). The clock varies between (Vdd-Vt) and an intermediate voltage, lower than Vref. Φ2, seen in FIG. 3d as well as in FIG. 4, also turns on the transistor 52. The capacitors 63 and 64 act as bootstrap capacitors and produce a high drive voltage on the gates of the load transistors 33 and 34. This permits rapid charging of the digit line which is to be restored to the "1" level, as seen by the line 56 of FIG. 4, and this speeds the restoration of the "1" level voltage in the selected storage cell 40. The transistors 65 and 66 in conjunction with the intermediate level 67 of the Φ3 clock provide the gate of the load transistor on the zero-going side of the sense amplifier. The operation of the sense amplifier is fully explained in U.S. Pat. No. 4,081,701.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. In a memory system of the type having an array of rows and columns of memory cells, a sense amplifier positioned at the center of each of the column lines, and dummy cells for each half of the column lines, the improvement wherein a plurality of rows of said dummy cells are positioned at spaced locations between the ends of each half of each column line, a plurality of said memory cells being connected to each column line half on both sides of each row of dummy cells.

2. Apparatus according to claim 1 wherein the memory cells and the dummy cells are of the one-transistor type with an MOS transistor and a capacitor.

3. Apparatus according to claim 1 wherein a selected one of the dummy cells on one side of a sense amplifier is addressed when a memory cell on the other side of the sense amplifier is addressed by a row line, with the distance between the selected dummy cell and the sense amplifier being about the same as that between the selected memory cell and the sense amplifier.

4. Apparatus according to claim 3 wherein the time delay introduced by the column line between the selected dummy cell and the sense amplifier is about equal to the average time delay introduced between addressed memory cell on the opposite side and the sense amplifier.

5. Apparatus according to claim 4 wherein the sense amplifiers are cross-coupled bistable circuits which begin a sense operation when the dummy cell and a memory cell are addressed.

6. Apparatus according to claim 5 wherein said dummy cells and memory cells are of the one-transistor type with an MOS transistor and a capacitor, and the sense amplifiers contain a pair of cross-coupled MOS driver transistors.

* * * * *